United States Patent
Hossain et al.

(10) Patent No.: US 6,348,413 B1
(45) Date of Patent: Feb. 19, 2002

(54) HIGH PRESSURE $N_2$ RTA PROCESS FOR $TIS_2$ FORMATION

(75) Inventors: Timothy Z. Hossain; Charles E. May, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/157,855

(22) Filed: Sep. 21, 1998

(51) Int. Cl.[7] .............................................. H01L 21/44
(52) U.S. Cl. ...................... 438/682; 438/680; 438/683; 257/770; 257/773
(58) Field of Search ................................ 438/682, 680, 438/683, 303, 305; 257/770, 773, 767

(56) References Cited

U.S. PATENT DOCUMENTS

| | | | |
|---|---|---|---|
| 4,900,257 A | | 2/1990 | Maeda ........................ 437/200 |
| 5,166,770 A | * | 11/1992 | Tang et al. .................. 257/770 |
| 5,352,631 A | | 10/1994 | Sitaram et al. ............. 437/200 |
| 5,608,249 A | | 3/1997 | Gonzalez .................... 257/306 |
| 5,652,180 A | | 7/1997 | Shinriki et al. ............. 437/190 |
| 6,049,133 A | * | 4/2000 | Hause et al. ................. 257/767 |
| 6,111,304 A | * | 8/2000 | Sonoda ........................ 257/536 |

OTHER PUBLICATIONS

Roger A. Haken; Application of the self-aligned titanium silicide process to very large-scale integrated n-metal-oxide-semiconductor and complementary metal-oxide-semiconductor technologies; J. Vac. Sci. Technol. B; vol. 3, No. 6; pp. 1657–1663; 1985.

R.M. Vadjikar et al.; The Effect of Processing Environment on the Lateral Growth of Titanium Silicide; J. Electrochem. Soc.: Solid-State Science and Technology; vol. 135, No. 10; pp. 2582–2586; 1988.

Stanley Wolf and Richard N. Tauber; *Silicon Processing for the VLSI Era;* vol. 2: Process Integration; pp. 144–152; 1990.

* cited by examiner

*Primary Examiner*—David Nelms
*Assistant Examiner*—Reneé R. Berry
(74) *Attorney, Agent, or Firm*—Timothy M. Honeycutt

(57) ABSTRACT

In one aspect of the present invention, a method of forming a layer of silicide on a surface of a silicon-containing structure surface that is separated from a first structure by a second structure is provided. The method includes the steps of forming a layer of silicide-forming material on the surface of the silicon-containing structure, and the first and second structures. The layer of silicide-forming material is annealed in an ambient containing a nitrogen bearing species at a pressure greater than about one atmosphere to form the layer of silicide on the surface of the silicon-containing structure. The nitrogen bearing species reacts with the silicide-forming material to retard the formation of silicide on the third structure. The method reduces the potential for silicide bridging between, for example, the gate and source/drain regions of a transistor during silicide contact formation.

24 Claims, 6 Drawing Sheets

HIGH PRESSURE N$_2$ RTA PROCESS FOR TIS$_2$ FORMATION

BACKGROUND OF THE INVENTION

1. Field of the Invention

This invention relates generally to semiconductor processing, and more particularly, to a method of fabricating a transistor with an improved salicidation process.

2. Description of the Related Art

Insulated gate field effect transistors ("IGFET"), such as metal oxide semiconductor field effect transistors ("MOSFET"), are some of the most commonly used electronic components in modem integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. A first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

In conventional salicidation, titanium is deposited on the gate, the sidewall spacers, and the source and drain regions. A one or two step anneal is performed to react the titanium with the polysilicon of the gate and the silicon of the source and drain regions to form TiSi$_2$. Following the anneal, an etch is performed to remove any unreacted titanium.

One of the principal functions of sidewall spacers is to separate the silicided gate from the source/drain regions. Despite the incorporation of spacers, silicide may form laterally and easily bridge the separation between the polysilicon gate electrode and the silicon source/drain regions causing the gate to become shorted to the source/drain regions. This so-called "bridging effect" occurs where silicon diffuses into the titanium regions that cover the sidewall spacers and subsequently reacts with the titanium.

Certain conditions tend to favor lateral TiSi$_2$ formation. Conventional furnace annealing in an inert gas atmosphere (e.g., argon for approximately 30 minutes) may foster rapid lateral TiSi$_2$ formation. Processing in the sub-0.25 $\mu$m domain also appears to raise the frequency of lateral silicide formation. In sub-0.25 $\mu$m processing, the minimum gate width may approach or even reach the dimensions of the grain boundaries between the individual grains of the polycrystalline silicon gate electrode. As the minimum device size approaches the dimensions of the grain boundaries in the polysilicon, the rate of silicon diffusion from the polysilicon into the titanium increases. The increased diffusivity is believed to stem from the elimination of pluralities of intersecting polysilicon grain boundaries that are present in larger scale processes. These grain boundaries act as natural barriers to silicon diffusion.

One method of controlling lateral TiSi$_2$ formation introduced at a time when 1.5 $\mu$m processing represented the state of the art, involves the introduction of a N$_2$ ambient during the titanium anneal. The ambient is maintained at atmospheric pressure or lower. Titanium absorbs a significant amount of nitrogen during the anneal, particularly at the titanium grain boundaries. The absorbed nitrogen clogs the grain boundary diffusion paths through the titanium. The result is a reduced diffusivity of silicon in the titanium and suppression of the lateral TiSi$_2$ reaction. Although TiN is formed near the outer surface of the titanium layer, the TiSi$_2$ reaction is dominant.

Although low pressure nitrogen ambient annealing has provided some measure of success in retarding bridging for larger minimum feature sizes, the shortcomings of the process have been revealed as design rules have scaled to 0.5 $\mu$m and below. At such small geometries, the available diffusion pathway for silicon atoms migrating into the titanium is so short that silicide stringers may quickly form before sufficient nitrogen has diffused into the titanium to interfere with the movement and bonding by the silicon atoms.

Another conventional method of suppressing lateral TiSi$_2$ formation involves careful tailoring of the anneal steps to reduce the potential for bridging. However, as is often the case in the thermal processing of integrated circuits in silicon, there are trade-offs in designing a thermal budget for a given process. Annealing titanium at higher temperatures generally produces a TiSi$_2$ layer with a lower sheet resistance. However, higher heating tends to exacerbate the potential for lateral TiSi$_2$ formation, and at temperatures above approximately 700° C., the titanium and silicon dioxide sidewall spacers may react to form titanium oxides. Any residues of this reaction can degrade device performance by compromising the integrity of the oxide or by producing bridging. This effect tends to be less severe in rapid thermal processing anneals. Conversely, lowering the anneal temperature can reduce the potential for lateral TiSi$_2$ formation, but often results in a higher sheet resistance for the TiSi$_2$ layer over the source and drain, and thus a lower performance integrated circuit. In short, achieving a suitable balance between anneal temperature, acceptable TiSi$_2$ sheet resistance, and lowered yields due to bridging is a difficult task and always subject to process variations.

The present invention is directed to overcoming or reducing one or more of the foregoing disadvantages.

SUMMARY OF THE INVENTION

In accordance with one aspect of the present invention, a method of forming a layer of silicide on a surface of a silicon-containing structure that is separated from a first structure by a second structure is provided. The method includes the steps of forming a layer of silicide-forming material on the surface of the silicon-containing structure, and the first and second structures. The layer of silicide-forming material is annealed in an ambient containing a nitrogen bearing species at a pressure greater than about one atmosphere to form the layer of silicide on the surface of the silicon-containing structure. The nitrogen bearing species reacts with the silicide-forming material to retard the formation of silicide on the third structure.

In accordance with another aspect of the present invention, a method of forming a layer of silicide on a source/drain region of a transistor that is separated from the gate electrode of the transistor by a spacer is provided. The method includes the steps of forming a layer of silicide-forming material on the source/drain region, the spacer and the gate electrode. The layer of silicide-forming material is annealed in an ambient containing a nitrogen bearing species at a pressure greater than about one atmosphere to form the layer of silicide on the source/drain region. The nitrogen bearing species reacts with the silicide-forming material to retard the formation of silicide on the spacer.

In accordance with another aspect of the present invention, a method of fabricating a transistor on a substrate is provided. The method includes the steps of forming a gate dielectric layer on the substrate and forming a gate electrode on the gate dielectric layer. First and second spacers are formed adjacent to the gate electrode. First and second source/drain regions are formed in the substrate. A layer of silicide is formed on the first and second source/drain regions by forming a layer of silicide-forming material on the first and second source/drain regions, the first and second spacers and the gate electrode, and annealing the layer of silicide-forming material in an ambient containing a nitrogen bearing species at a pressure greater than about one atmosphere to form the layer of silicide on the first and second source/drain regions. The nitrogen bearing species reacts with the silicide-forming material to retard the formation of silicide on the first and second spacers.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
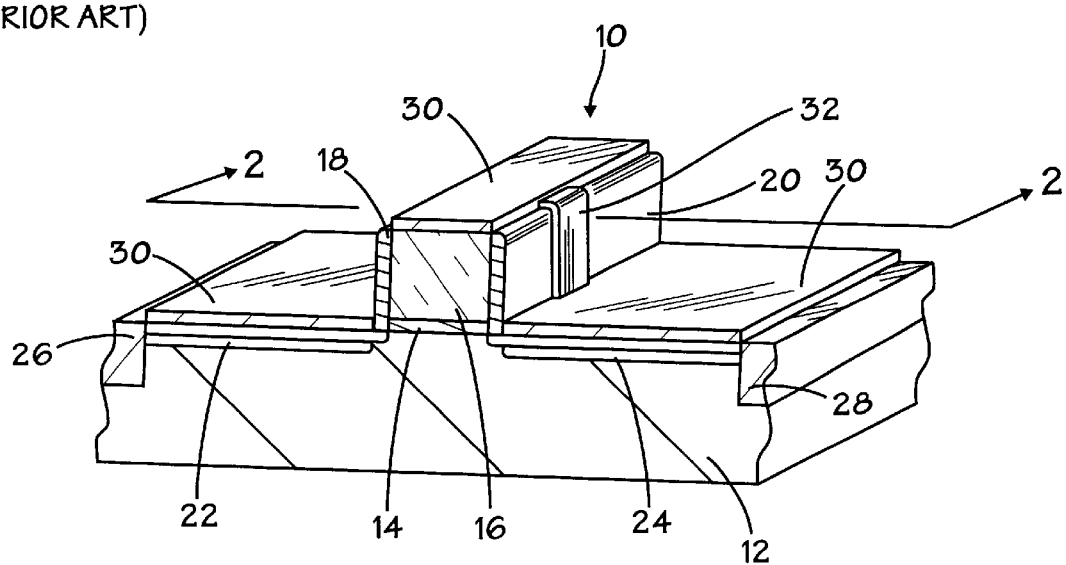
FIG. 1 is a cross-sectional pictorial view of an exemplary conventional integrated circuit transistor formed with a $TiSi_2$ stringer.
Figure 2:
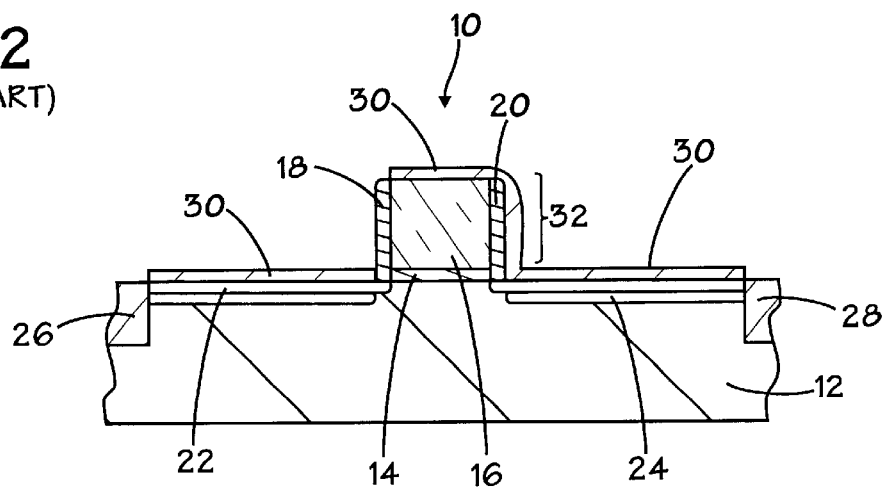
FIG. 2 is a cross-sectional view of FIG. 2 taken at section 2—2.

In the drawings described below, reference numerals are generally repeated where identical elements appear in more than one figure. Turning now to the drawings, and initially to FIGS. 1 and 2, there is shown a conventional MOSFET 10 formed on a silicon substrate 20. FIG. 1 is a pictorial cross-sectional view of the MOSFET 10 and FIG. 2 is a cross-sectional view of FIG. 1 taken at section 2—2. The MOSFET 10 includes a gate oxide layer 14 formed on the substrate 20 and a polysilicon gate electrode 16 formed on the gate oxide layer 14. Dielectric sidewall spacers 18 and 20 straddle the gate electrode 16 and the gate oxide layer 14. A source region 22 and a drain region 24 are formed in the substrate 20 and are generally self-aligned to the gate electrode 16. Trench isolation structures 26 and 28 in the substrate 20 separate the MOSFET 10 from other structures in the substrate 20.

The MOSFET 10 is depicted immediately following a conventional salicidation process using titanium as the silicide-forming material. A layer 30 of $TiSi_2$ is formed over the source region 22, the gate electrode 16, and the drain region 24. To illustrate the problem of bridging, it is assumed that lateral formation of $TiSi_2$ occurred during the salicidation process, resulting in the formation of a stringer 32 composed of $TiSi_2$ that bridges the portion of the $TiSi_2$ layer 30 overlying the gate electrode 16 to the portion of the $TiSi_2$ layer 30 overlying the drain region 24. Like the $TiSi_2$ layer 30 overlying the gate electrode 16 and the source and drain regions 22 and 24, the stringer 32 is left behind following an etch to remove any unreacted titanium from the sidewall spacers 18 and 20.

Figure 3:
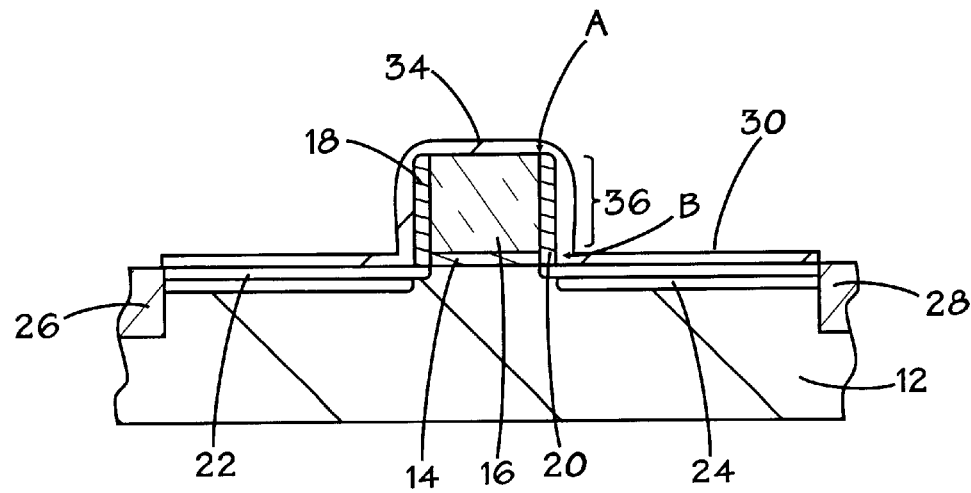
FIG. 3 is a cross-sectional view like FIG. 2 depicting the transistor of FIG. 1 prior to the silicide reaction.

As noted above, formation of a stringer, such as the stringer 32, is the by-product of unwanted diffusion of silicon into the titanium. An illustrative pathway for stringer-forming silicon diffusion into the titanium in the MOSFET 10 may be understood by referring now to FIG. 3. FIG. 3 is a cross-sectional view like FIG. 2, but depicts the MOSFET 10 after deposition of a titanium layer 34, and prior to the silicide reaction. Although it is theoretically possible for silicon to diffuse from the gate electrode 16 and the drain region 24 into the titanium layer 34 at any point or points where silicon is in contact with the titanium 34, the shortest, and therefore the most potentially troubling pathway for the lateral formation of $TiSi_2$ is represented by the path between the point A extending down the vertical interface 36 between the sidewall spacer 20 and the titanium layer 34 and the point B at the intersection of the lower end of the sidewall spacer 20, the titanium layer 34, and the upper surface of the substrate 12. This relatively short pathway for lateral formation of $TiSi_2$ is made possible by the relatively close proximity of two sources of silicon, the polysilicon gate electrode 16, and the substrate 12, both in contact with a common source of titanium, the titanium layer 34.

Figure 4:
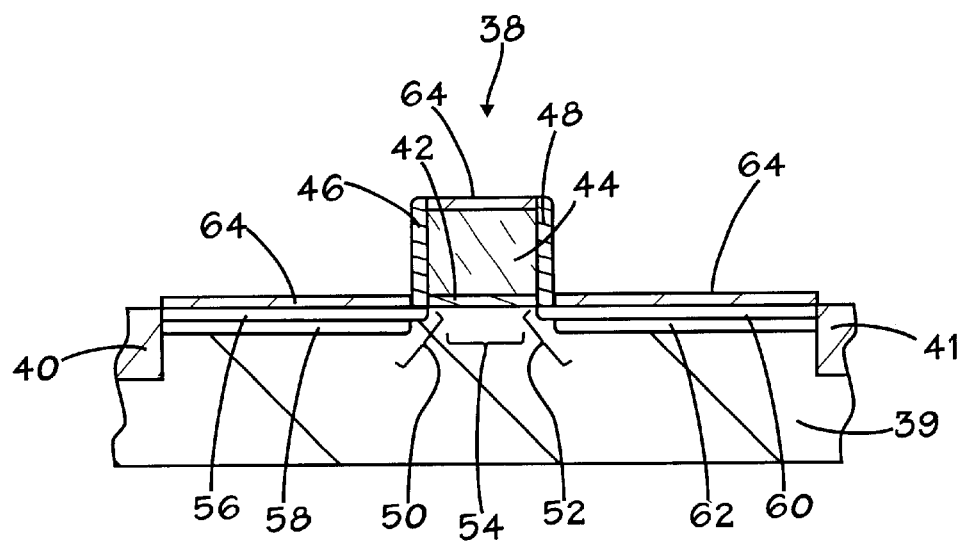
FIG. 4 is a cross-sectional view of a substrate showing an exemplary embodiment of a transistor fabricated in accordance with the present invention.
Figure 5:
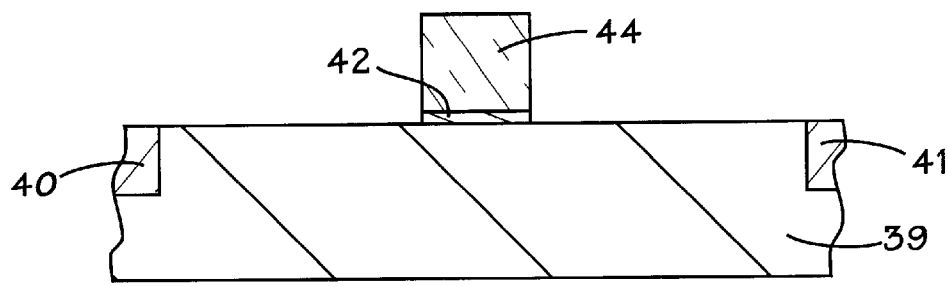
FIG. 5 is a cross-sectional view of the substrate of FIG. 4 and depicts formation of a gate dielectric layer and a gate electrode in accordance with the present invention.

An exemplary embodiment of a transistor 38 fabricated in accordance with the present invention may be understood by referring now to FIG. 4, which is a cross-sectional view of the transistor 38 formed on a semiconductor substrate 39. The semiconductor substrate 14 may be composed of n-doped, or p-doped silicon, silicon-on-insulator, or other suitable substrate materials. Isolation structures 40 and 41 electrically isolate the transistor 38 from other structures in the substrate 39. The isolation structures 40 and 41 may be trench isolation structures, field oxide regions or the like.

The transistor 38 may be a field effect transistor, a bipolar transistor or other type, and may be implemented as a n-channel, a p-channel or other type of device. For the purpose of illustrating an exemplary process flow, the transistor 38 is depicted as a field effect transistor and the process flow will be described in the context of a n-channel device.

The transistor 38 includes an insulating or gate dielectric layer 42 that is formed on the substrate 40 and a gate electrode 44 that is formed on the first insulating layer 42. A pair of insulating sidewall spacers 46 and 48 are positioned adjacent the gate dielectric layer 42. First and second source/drain regions 50 and 52 are formed in the substrate 40 and separated laterally to define a channel region 54 in the substrate 39 beneath the gate electrode 44. The source/drain region 50 consists of a lightly doped drain ("LDD") structure 56 and an overlapping heavier doped region 58. The source/drain region 52 consists of like LDD and heavier doped structures and regions 60 and 62. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization.

To provide for enhanced ohmic contact between the gate electrode 44 and the source/drain regions 50 and 52, and any later-formed metallization, a silicide layer 64 is formed over the source/drain regions 50 and 52, and the gate electrode 44. As described below, the process of forming the silicide layer 64 in accordance with the present invention reduces the risk of bridge formation.

An exemplary process for forming the transistor 38 in accordance with the present invention may be understood by referring now to FIGS. 5, 6, 7, and 8, and initially to FIG. 4, which is a cross-sectional view of the substrate 39. For the purpose of illustration, the process will be described in the context of a n-channel device. However, the skilled artisan will appreciate that the transistor 38 may be implemented as n-channel, p-channel or another type of device. The skilled artisan will also appreciate that the process may be applied to a single or multiple transistors.

The substrate 39 is provided with the isolation structures 40 and 41. In an exemplary embodiment, the isolation structures 40 and 41 are trench isolation structures and may be fabricated using well known techniques to fabricate isolation trenches, such as, for example, shallow trench isolation and reflow, deep trench isolation, or other suitable trench isolation techniques. The isolation trenches 40 and 41 are advantageously composed of a suitable dielectric material, such as $SiO_2$ or other suitable dielectric trench isolation materials. Conventional LOCOS structures may be alternatively used to provide electrical isolation.

The gate dielectric layer 42 and the gate electrode 44 are fabricated by initially forming a layer of insulating material on the substrate 39 and a layer of conducting material on the insulating material, and subsequently masking the conducting material and anisotropically etching the conductor and insulating layers to define the layers 42 and 44. The anisotropic etch to define the gate electrode 44 and the gate dielectric layer 42 may be by reactive ion etching, plasma etching or other suitable etching techniques.

The gate dielectric layer 42 may be composed of $SiO_2$, $Ta_2O_5$, or other suitable gate dielectric material and may be formed via thermal oxidation, chemical vapor deposition ("CVD") or the like. The gate dielectric layer 42 may be about 20 to 50 Å thick and is advantageously about 25 Å thick. In an exemplary embodiment, the layer 42 is $SiO_2$ and may be grown by exposing the substrate 39 to an oxygen containing ambient at approximately 800 to 1050° C. for approximately 10 to 60 seconds in a rapid thermal anneal process ("RTA"), or for approximately 5 to 20 minutes in a diffusion tube process. A nitrogen bearing species, such as NO or $N_2O$, may be added to the ambient to infuse nitrogen into the layer 42 to inhibit polysilicon depletion and reduce hot carrier effects.

The conductor layer used to form the gate electrode 44 may be composed of a variety of conducting materials, such as, for example, polysilicon, amorphous silicon, tungsten, tantalum, titanium or other suitable conducting materials. In an exemplary embodiment, the material for the gate electrode 44 is polysilicon. Later doping of the gate electrode 44 will render the polysilicon conductive. Well known techniques for applying polysilicon, such as CVD, may be used to deposit the gate electrode 44. In an exemplary embodiment, the polysilicon is deposited at or above about 625° C. to a thickness of about 100 to 1200 Å, and advantageously to about 600 Å.

Figure 6:
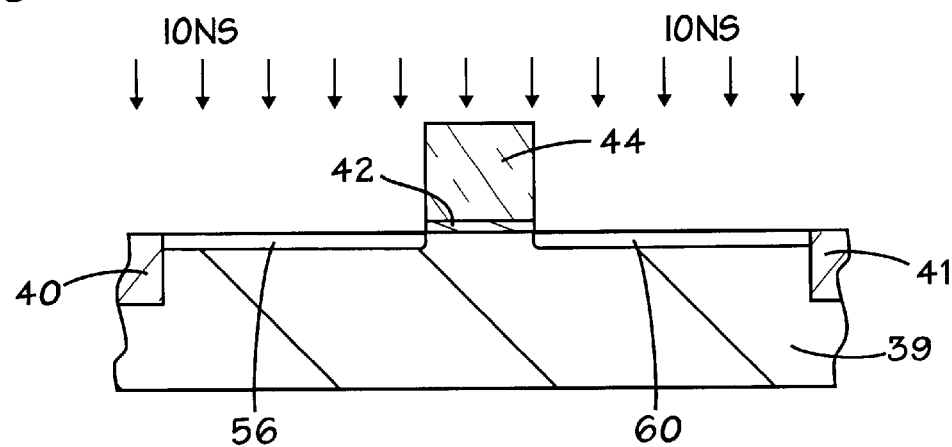
FIG. 6 is a cross-sectional view like FIG. 5 depicting formation of lightly doped drain structures in accordance with the present invention.
Figure 7:
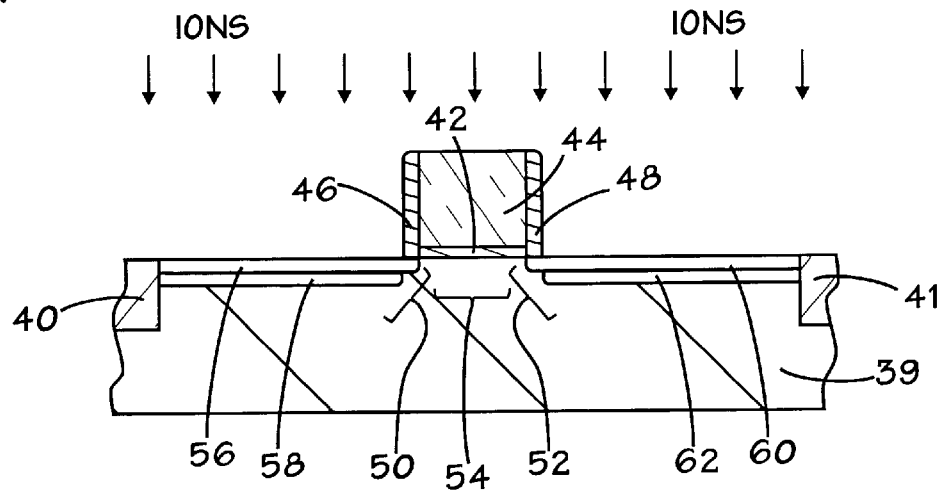
FIG. 7 is a cross-sectional view like FIG. 6 depicting formation of heavier doped source/drain regions and dielectric sidewall spacers in accordance with the present invention.

Referring now to FIGS. 6 and 7, the source/drain regions 50 and 52 are formed in the substrate 39. Ion implantation, diffusion or the like may be used. In an exemplary embodiment, ion implantation is used in a two-step implant process. The first implant establishes the LDD structures 56 and 60 that are self-aligned to the gate electrode 44. The energy and dosage of the LDD implant will depend upon the dopant type. In an exemplary embodiment for n-channel, the dopant is arsenic. The dosage may be about 5E13 to 8E14 $cm^{-2}$ and is advantageously about 4E14 $cm^{-2}$. The energy may be about 5 to 30 keV and is advantageously about 20 keV. The implant angle may be 0°.

As shown in FIG. 7, the insulating sidewall spacers 46 and 48 are formed adjacent to the gate electrode 44 and may be composed of a suitable sidewall spacer material, such as, for example, $SiO_2$, $Si_3N_4$, or similar suitable sidewall spacer materials. The spacers 46 and 48 may be fabricated by forming a layer of the selected material by oxidation, CVD, or other technique, followed by anisotropic etching to leave the spacers 46 and 48. The spacers 46 and 48 are advantageously $Si_3N_4$, may be about 200 to 800 Å wide and are advantageously about 500 Å wide.

Following formation of the sidewall spacers 46 and 48, a second implant is performed self-aligned to the sidewall spacers 46 and 48 to establish the heavier doped regions 58 and 62. The energy and dosage of the S/D implant will depend upon the dopant type. In an exemplary embodiment, the dopant is arsenic. The dosage may be about 2E15 to 7E15 $cm^{-2}$ and is advantageously about 4E15 $cm^{-2}$. The energy may be about 5 to 50 keV and is advantageously about 40 keV. The implant angle may be 0°. The lateral spacing of the source/drain regions 50 and 52 defines the channel region 54 underlying the gate dielectric layer 42. Lateral diffusion of the dopants in the source/drain regions 50 and 52 during subsequent high temperature steps will typically shorten the length of the channel region 54. The magnitude of the change will depend on the diffusivity of the dopants used to establish the source/drain regions 50 and 52.

Figure 8:
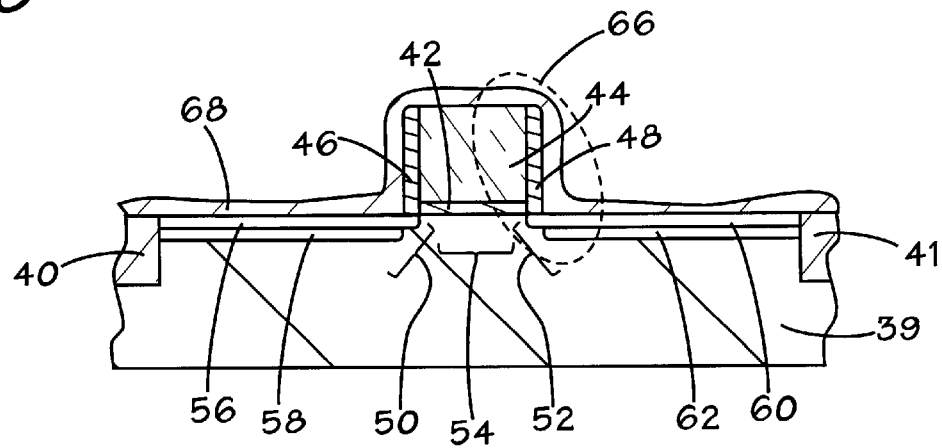
FIG. 8 is a cross-sectional view like FIG. 7 depicting formation of a layer of a silicide-forming material on the substrate in accordance with the present invention.
Figure 9:
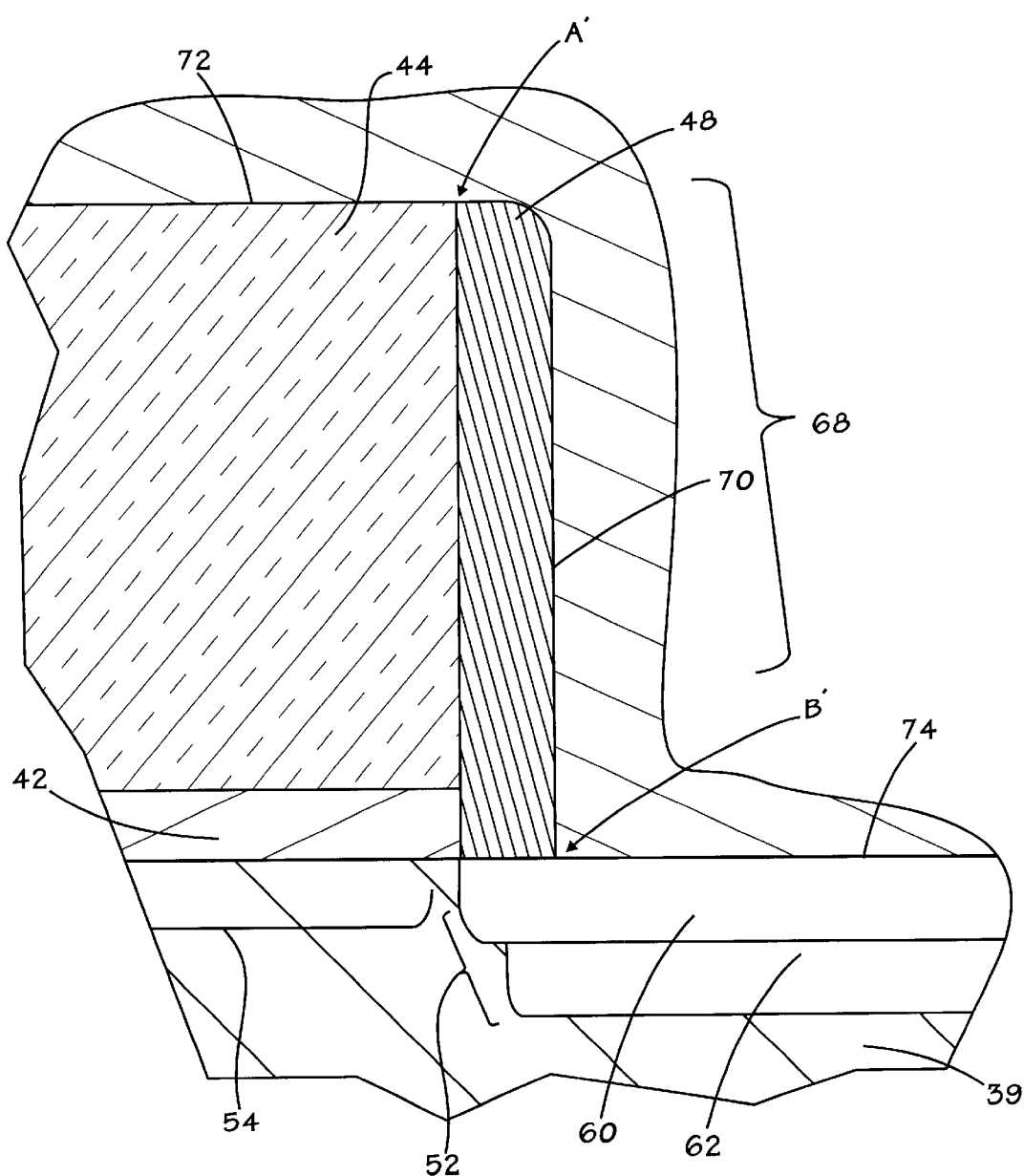
FIG. 9 is a highly magnified cross-sectional view of a portion of FIG. 8 in accordance with the present invention.
Figure 10:
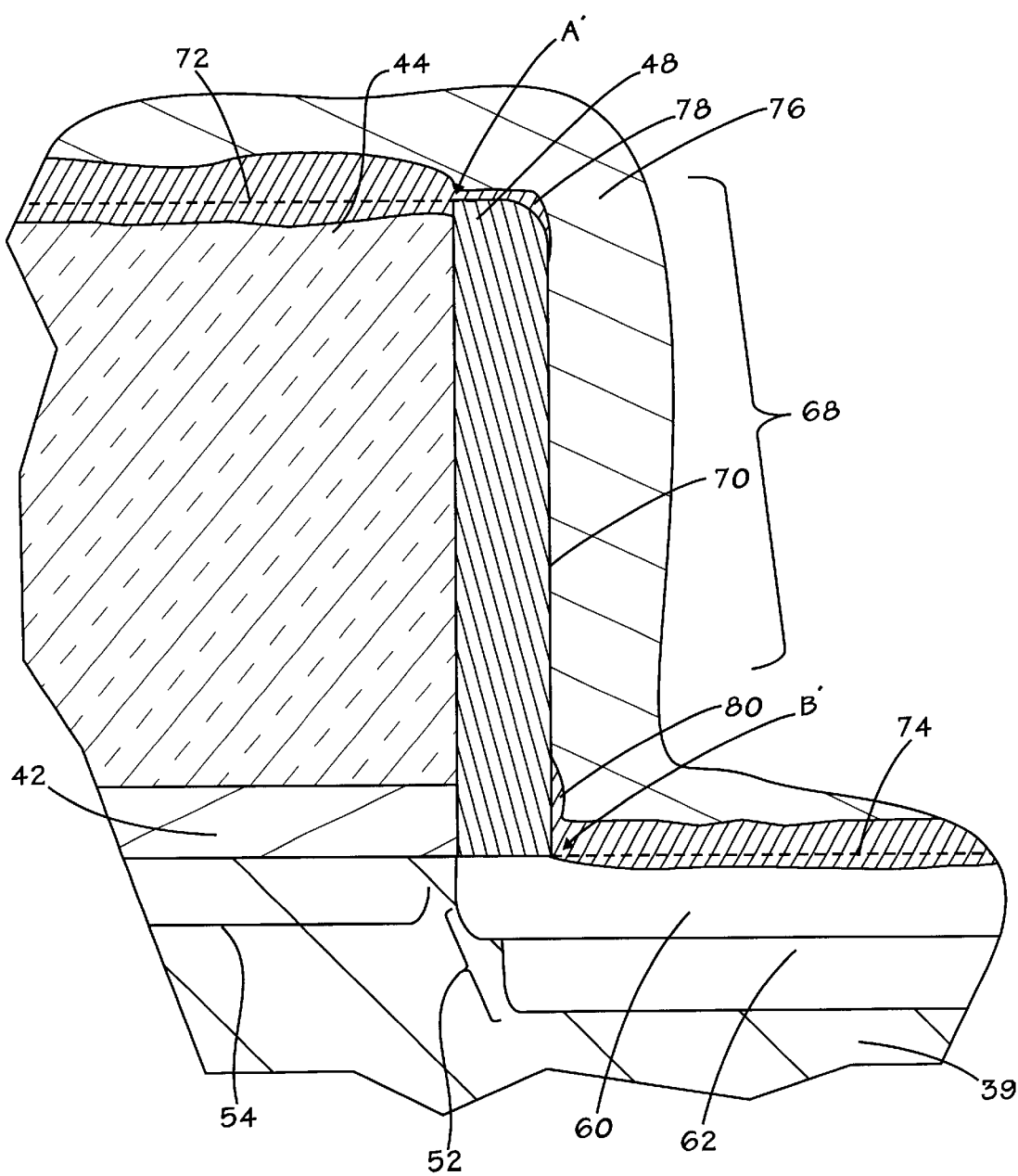
FIG. 10 is a cross-sectional view like FIG. 9 following anneal of the layer of silicide-forming material in accordance with the present invention.

The formation of the silicide layer 64 depicted in FIG. 4 may be understood by referring now to FIGS. 8, 9 and 10. FIG. 8 is a cross sectional view like FIG. 7, and FIG. 9 is a highly magnified cross-sectional view of the portion of FIG. 8 circumscribed generally by the dashed oval 66. Initially, and as shown in FIG. 8, the substrate 39, the gate electrode 44, and the spacers 46 and 48 are conformally coated with a layer 68 of silicide-forming material. The layer 68 may be composed of a variety of silicide-forming materials, such as titanium, cobalt, platinum, palladium, nickel, tungsten, tantalum, molybdenum, or the like, and may be applied by CVD, sputter or like techniques. In an exemplary embodiment, the layer 68 is composed of titanium and is deposited by CVD. The desired thickness for the silicide-forming layer 68 will depend upon a variety of factors, such as the depths of the junctions of the source/drain regions 50 and 52, the sheet resistance of the ultimately formed silicide material, as well as the acceptable series resistances for the contacts to the source/drain regions 50 and 52 and the gate electrode 44. In an exemplary embodiment, the layer 68 is deposited with a thickness of about 300 to 600 Å and advantageously about 400 θ.

For simplicity of illustration, the area including the right hand side of the gate electrode 44 and the spacer 48 will be used to describe the details of the silicide-forming reaction. However, the discussion applies equally to the opposite area which includes the spacer 46. As shown in FIG. 9, the pathway between points A' and B' along the outer surface 70 of the spacer 48 is the shortest diffusion pathway along which silicon atoms diffusing from the upper surface 72 of the gate electrode 44 and the upper surface 74 of the substrate 39 may migrate through the titanium layer 68 and react with the titanium atoms therein to form an unwanted $TiSi_2$ bridge. The same would be true even if only one of the structures, either the gate electrode 44 or the substrate 39, provided a source of silicon atoms. For example, the gate electrode 44 could be composed of tungsten and would not contribute to silicon diffusion. However, such a tungsten gate electrode 44 could still be shorted by a bridge formed from silicon atoms diffusing from the source/drain region 52 along the path from point B' to point A' or a path generally parallel thereto.

Referring now to FIG. 10, the layer 68 is annealed to initiate the silicide-forming reaction. The reaction between the titanium of the layer 68 and the gate electrode 44 and the substrate 39 establishes the silicide layer 64 on the gate electrode 44 and the substrate 39. The silicide reaction is consumptive of silicon so the silicide layer 64 now extends below the original upper surfaces 72 and 74 of the gate electrode 44 and the substrate 39 (shown in phantom). During the anneal, silicon will diffuse into the layer 68 from the gate electrode 44 and the substrate 39 and react to form $TiSi_2$. Some silicon atoms will also diffuse along the outer surface 70 from points A' and B'.

To retard the conversion of titanium to $TiSi_2$ along the pathway between A' and B', titanium layer 68 is annealed in an ambient containing a nitrogen bearing species and at a pressure greater than about 1 atmosphere.

The nitrogen bearing species reacts with the titanium of the layer 68 to form a layer 76 of TiN. High pressure results in a significant diffusion of the nitrogen bearing species through the titanium layer 68 and the formation TiN all the way to the outer surface 70 of the spacer 48. In those areas that are rich in silicon atoms, such as the upper surface 72 of the gate electrode 44 and the upper surface 74 of the substrate 39, the TiN forming reaction will roughly balance against the $TiSi_2$ forming reaction, resulting in approximately equal thicknesses of $TiSi_2$ and TiN. However, in the region that is initially silicon poor, but is particularly susceptible to silicon diffusion through the titanium layer 68, namely the pathway between point A' and point B', the TiN forming reaction will be predominant and result in the complete conversion of titanium to TiN along most of the pathway between points A' and B' as shown in FIG. 9. Some formation of short fingers 78 and 80 of $TiSi_2$ along the outer surface 70 of the sidewall 48 is anticipated. However, the high pressure nitrogen anneal will prevent bridging between the fingers 78 and 80.

Desirable nitrogen diffusion rates may be achieved at a variety of pressures above about 1 atmosphere. The upper limit of the ambient pressure will be determined, in large part, by the pressure capacity of the tool used to process the substrate 39 wafer handling. In an exemplary embodiment, the pressure may be about 1 to 5 atmospheres, and is advantageously about 2 atmospheres.

A variety of nitrogen bearing species may be suitable for the nitrogen anneal. Exemplary species include, for example, atomic nitrogen, $N_2$, $NH_3$, $N_2H_4$, mixtures of these or the like. In an exemplary embodiment, the nitrogen bearing species is $N_2$. The anneal may be conducted at about 600 to 750° C. for about 10 to 60 seconds in a RTA process. A quick thermal cycle is desirable where significant migration of dopant atoms from the source/drain regions 50 and 52 and the gate electrode 44 would occur during a more lengthy thermal cycle. However, if dopant migration may be tolerated, the aforementioned anneal of the silicide-forming layer 68 may be accomplished in a furnace process at the same temperature ranges, but for between about 30 and 60 minutes.

Referring now to FIGS. 4 and 9, the TiN layer 76 may be removed following the nitrogen ambient anneal using well known titanium-TiN etch processes, such as a dip in ammonium hydroxide, peroxide and water in a 1:1:5 ratio at about 20 to 80° C. Any unreacted titanium may then be removed using well known RCA cleaning techniques. A final anneal may then be performed at about 600 to 700° C. for about 20 to 40 seconds to reheat and stabilize the silicide and yield the silicide layer 64 depicted in FIG. 4.

The high temperature thermal steps to form the silicide layer 64 may also serve to anneal the source/drain regions 50 and 52. However, a separate anneal may be performed if desired by heating the substrate 39 to about 750 to 1000° C. for about 10 to 30 seconds in a RTA process, or for about 10 to 30 minutes in a furnace process.

The skilled artisan will appreciate that the process of the present invention may be applied to many situations where a silicide layer is to be formed on the surface of a silicon-containing structure, and the surface of the silicon-containing structure is separated from one structure by a second structure. For example, in the illustrated embodiment, the silicide layer 64 is formed on the upper surface 74 of the silicon-containing substrate 39 and the upper surface 74 is separated from one structure, the gate electrode 44, by a second structure, the spacer 48.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming a layer of silicide on a surface of a silicon-containing structure that is separated from a first structure by a second structure, comprising the steps of:

forming a layer of silicide-forming material on the surface of the silicon-containing structure, and the first and second structures; and annealing the layer of silicide-forming material in an ambient containing a nitrogen bearing species at a pressure greater than about one atmosphere to form the layer of silicide on the surface of the silicon-containing structure, the nitrogen bearing species reacting with the silicide-forming material at a sufficiently high pressure to convert substantially all of the silicide forming material on the second structure to a nitride compound and thereby retard the formation of silicide on the second structure.

2. The method of claim 1, wherein the nitrogen bearing species comprises N, $N_2$, $NH_3$, or $N_2H_4$.

3. The method of claim 1, wherein the nitrogen bearing species comprises $N_2$.

4. The method of claim 1, wherein the silicide-forming material comprises titanium, cobalt, platinum, palladium, nickel, tungsten, tantalum, or molybdenum.

5. The method of claim 1, wherein the silicide-forming material comprises titanium.

6. The method of claim 1, wherein the step of annealing comprises heating the layer of silicide-forming material to about 600 to 750° C. for about 10 to 60 seconds.

7. The method of claim 6, comprising the step of reheating the layer of silicide.

8. The method of claim 7, wherein the step of reheating comprises heating at about 600 to about 700° C. for about 20 to 40 seconds.

9. The method of claim 1, wherein the pressure of the ambient is greater than about 1 and less than about 5 atmospheres.

10. The method of claim 1, wherein the pressure of the ambient is about 2 atmospheres.

11. The method of claim 1, wherein the reaction between the nitrogen bearing species and the silicide-forming material produces a nitride compound.

12. The method of claim 11, comprising the step of removing the nitride compound and any unreacted silicide-forming material.

13. A method of forming a layer of silicide on a source/drain region of a transistor that is separated from the gate electrode of the transistor by a spacer, comprising the steps of:

forming a layer of silicide-forming material on the source/drain region, the spacer and the gate electrode; and annealing the layer of silicide-forming material in an ambient containing a nitrogen bearing species at a pressure greater than about one atmosphere to form the layer of silicide on the source/drain region, the nitrogen bearing species reacting with the silicide-forming material at a sufficiently high pressure to convert substantially all of the silicide forming material on the spacer to a nitride compound and thereby retard the formation of silicide on the spacer.

14. The method of claim 13, wherein the nitrogen bearing species comprises N, $N_2$, $NH_3$, or $N_2H_4$.

15. The method of claim 13, wherein the nitrogen bearing species comprises $N_2$.

16. The method of claim 13, wherein the silicide-forming material comprises titanium, cobalt, platinum, palladium, nickel, tungsten, tantalum, or molybdenum.

17. The method of claim 13, wherein the silicide-forming material comprises titanium.

18. The method of claim 13, wherein the step of annealing comprises heating the layer of silicide-forming material to about 600 to 750° C. for about 10 to 60 seconds.

19. The method of claim 18, comprising the step of reheating the layer of silicide.

20. The method of claim 19, wherein the step of reheating comprises heating at about 600 to about 700° C. for about 20 to 40 seconds.

21. The method of claim 13, wherein the pressure of the ambient is greater than about 1 and less than about 5 atmospheres.

22. The method of claim 13, wherein the pressure of the ambient is about 2 atmospheres.

23. The method of claim 13, wherein the reaction between the nitrogen bearing species and the silicide-forming material produces a nitride compound.

24. The method of claim 23, comprising the step of removing the nitride compound and any unreacted silicide-forming material.

* * * * *

UNITED STATES PATENT AND TRADEMARK OFFICE
CERTIFICATE OF CORRECTION

PATENT NO. : 6,348,413 B1
DATED : February 19, 2002
INVENTOR(S) : Timothy Z. Hossain et al.

It is certified that error appears in the above-identified patent and that said Letters Patent is hereby corrected as shown below:

Column 1,
Line 13, delete "modem" and substitute -- modern -- therefor; and

Column 7,
Line 21, delete "Θ" and substitute -- Å -- therefor.

Signed and Sealed this

Twelfth Day of November, 2002

Attest:

Attesting Officer

JAMES E. ROGAN
Director of the United States Patent and Trademark Office